(12) United States Patent
Plettner et al.

(10) Patent No.: US 9,390,887 B2
(45) Date of Patent: Jul. 12, 2016

(54) NON-INVASIVE CHARGED PARTICLE BEAM MONITOR

(71) Applicant: KLA-Tencor Corporation, Milpitas, CA (US)

(72) Inventors: Thomas Plettner, San Ramon, CA (US); John Gerling, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/486,739

(22) Filed: Sep. 15, 2014

(65) Prior Publication Data

US 2015/0076350 A1    Mar. 19, 2015

Related U.S. Application Data

(60) Provisional application No. 61/878,609, filed on Sep. 17, 2013.

(51) Int. Cl.
*H01J 37/22* (2006.01)
*H01J 37/28* (2006.01)
*H01J 37/244* (2006.01)

(52) U.S. Cl.
CPC ............ *H01J 37/244* (2013.01); *H01J 37/22* (2013.01); *H01J 37/28* (2013.01); *H01J 2237/2482* (2013.01); *H01J 2237/24485* (2013.01); *H01J 2237/24507* (2013.01); *H01J 2237/24535* (2013.01); *H01J 2237/24542* (2013.01)

(58) Field of Classification Search
CPC .......... H01J 37/22; H01J 37/28; H01J 37/244
See application file for complete search history.

(56) References Cited

U.S. PATENT DOCUMENTS

| 5,281,820 A | 1/1994 | Groh et al. |
| 6,552,347 B1 | 4/2003 | Dimcovski |

(Continued)

FOREIGN PATENT DOCUMENTS

| JP | 07153410 A | 6/1995 |
| JP | 2007183186 A | 7/2007 |

OTHER PUBLICATIONS

Co-Pending U.S. Appl. No. 14/476,537, to John Gerling et al., filed Sep. 3, 2014.

(Continued)

*Primary Examiner* — David Porta
*Assistant Examiner* — Faye Boosalis
(74) *Attorney, Agent, or Firm* — Joshua D. Isenberg; JDI Patent

(57) ABSTRACT

An electromagnetic wakefield detector placed in close proximity to a design trajectory of a non-relativistic charged particle beam produces an optical signal in response to passage of the charged particle beam without interrupting the charged particle beam. A photon detector receives the optical signal and produces a corresponding output. The wakefield detector may be based on the electro optic effect. Specifically, the detector may measure the effect of the charged particle beam a beam of radiation on the phase of radiation travelling parallel to the beam in a nearby electro optic waveguide. This abstract is provided to comply with rules requiring an abstract that will allow a searcher or other reader to quickly ascertain the subject matter of the technical disclosure. It is submitted with the understanding that it will not be used to interpret or limit the scope or meaning of the claims.

21 Claims, 12 Drawing Sheets

(56) References Cited

U.S. PATENT DOCUMENTS

| | | |
|---|---|---|
| 8,513,619 B1 | 8/2013 | Nasser-Ghodsi et al. |
| 8,618,513 B2 | 12/2013 | Plettner et al. |
| 2004/0240035 A1 | 12/2004 | Zhilkov |
| 2010/0264904 A1* | 10/2010 | Wu .................. G01R 31/308 324/97 |
| 2014/0218503 A1 | 8/2014 | Gerling et al. |
| 2014/0239805 A1 | 8/2014 | Plettner |

OTHER PUBLICATIONS

Co-Pending U.S. Appl. No. 14/485,588, to Thomas Plettner et al., filed Sep. 12, 2014.

Co-Pending U.S. Appl. No. 14/485,574, to Thomas Plettner et al., filed Sep. 12, 2014.

U.S. Appl. No. 61/874,834, to John Gerling et al., filed Sep. 6, 2013.

U.S. Appl. No. 61/878,545, to Tomas Plettner et al., filed Sep. 16, 2013.

U.S. Appl. No. 61/878,606, to Tomas Plettner et al., filed Sep. 17, 2013.

U.S. Appl. No. 61/878,609, to Tomas Plettner et al., filed Sep. 17, 2013.

International Search Report and Written Opinion for International Application No. PCT/US2014/055898, dated Dec. 9, 2014.

* cited by examiner

NON-INVASIVE CHARGED PARTICLE BEAM MONITOR

CLAIM OF PRIORITY

This application is a nonprovisional of and claims the priority benefit of commonly owned, U.S. Provisional Patent Application No. 61/878,609, to Tomas Plettner and John Gerling, filed Sep. 17, 2013, and entitled "ELECTRO-OPTIC ELECTRON BEAM MONITOR", the entire disclosures of which are incorporated herein by reference.

FIELD OF THE DISCLOSURE

Aspects of the present disclosure relate to charged particle beam diagnostics, and more particularly, to an apparatus and a method for miscellaneous non-invasive beam diagnostic capabilities for SEM tools and other charged particle based systems.

BACKGROUND

In traditional SEM tools, beam current is determined by intercepting the beam at some plane either in the gun or column. This invasive beam monitoring requires the beam to be intercepted for its current to be determined, and thus no beam is striking at the image plane and the SEM column is not imaging. To get around this, a certain "duty cycle" is imposed on the system if the beam current is to be monitored periodically. This negatively impacts the throughput of the SEM system.

In current methods of obtaining beam position, the beam position with respect to the optical axis inside the column is determined by a "wobble" function that deliberately perturbs one or more elements in the column from their nominal value to determine the beam position. When set in the wobble function the column, cannot be employed for imaging. Hence, this method also imposes a duty cycle, where a fraction of the useful imaging time is lost to a specific monitoring or tuning function that has to be implemented periodically as the beam drifts.

Another important beam characteristic many SEM tools can collect is an energy spectrum of the primary electron beam. All present methods of energy spectrum collection known to the inventors of the present disclosure involve an invasive means of energy spectrum detection such as directing the beam into a detector array placed at a dispersive plane in the beam path. The electron beam is captured and ends at the detector plane of a spectrometer.

In particle accelerators you use a pair of plates that produce an image charge as a beam containing a bunch of charges passes through it. The image charges produce pulses as the beam passes through it. The difference between pulses from the two plates can determine the position of the beam relative to the axis between the plates. The sum of the pulses at the two plates is proportional to the bunch charge. This works well if the beam is pulsed and the peak current is quite larger, e.g., of order 1 amp to 1 kiloamp. For many charged particle beam tools, such as electron microscopes, the beam is continuous and the current is very weak (nanoamps).

For very charged particle beam short pulses (e.g., femtoseconds) electro-optic crystals are sometimes used to sample fields from bunched electron beams in particle accelerators. The change to the index of refraction of the electro-optic crystal can be probed with a laser beam.

It is within this context that aspects of the present disclosure arise.

BRIEF DESCRIPTION OF THE DRAWINGS

Objects and advantages of the invention will become apparent upon reading the following detailed description and upon reference to the accompanying drawings in which.

DETAILED DESCRIPTION

Figure 1:
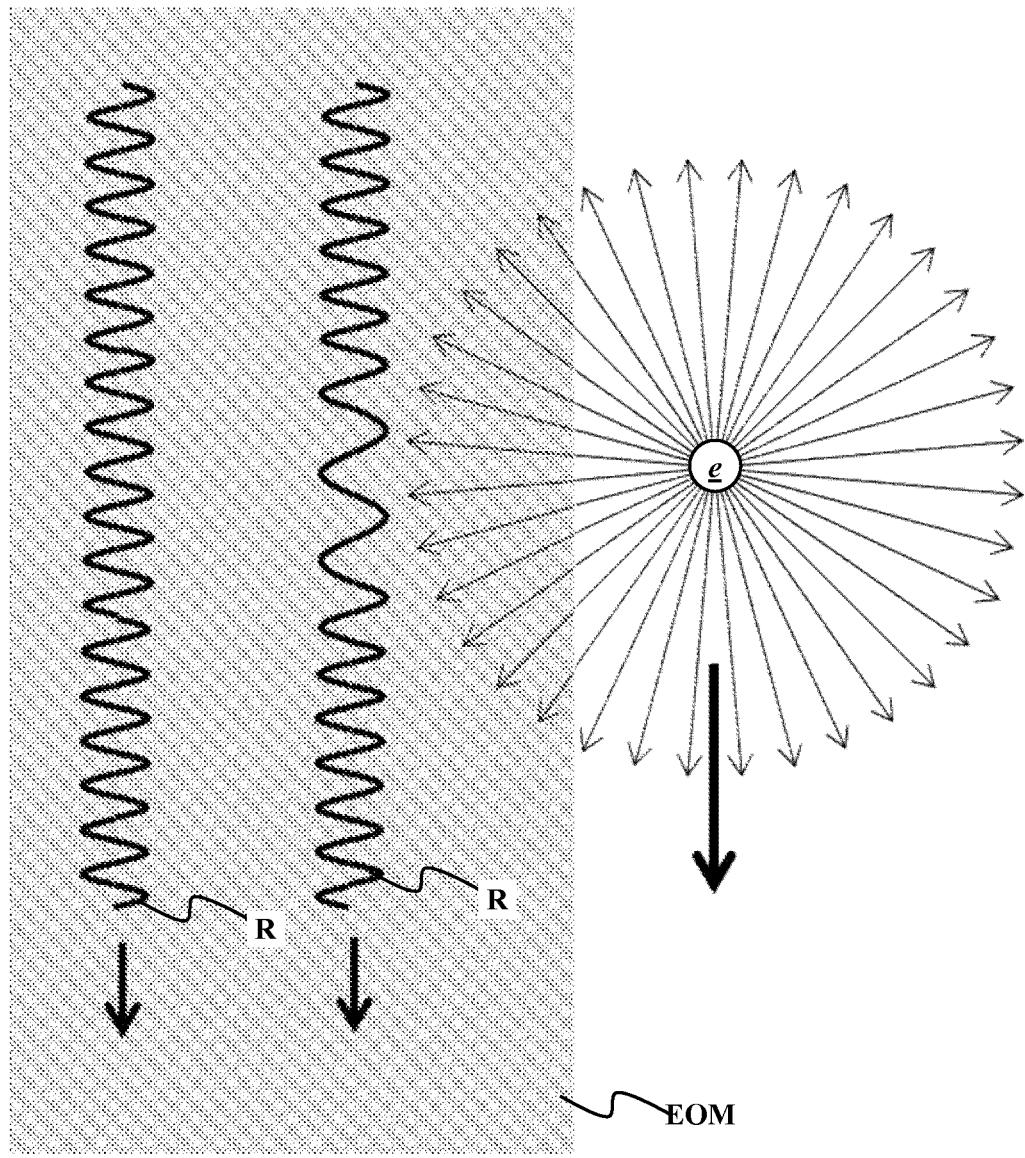
FIG. 1 schematically illustrates how interaction between a charged beam and an electro optic material can be used to probe beam characteristics in accordance with aspects of the present disclosure.

In the following Detailed Description, reference is made to the accompanying drawings, which form a part hereof, and in which is shown by way of illustration specific embodiments in which the invention may be practiced. The drawings show illustrations in accordance with examples of embodiments, which are also referred to herein as "examples". The drawings are described in enough detail to enable those skilled in the art to practice the present subject matter. The embodiments can be combined, other embodiments can be utilized, or structural, logical, and electrical changes can be made without departing from the scope of what is claimed. In this regard, directional terminology, such as "top," "bottom," "front,"

"back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims.

As used herein, the term "light" generally refers to electromagnetic radiation characterized by a frequency somewhere in a range of frequencies running from the infrared through the ultraviolet, roughly corresponding to a range of vacuum wavelengths from about 1 nanometer ($10^{-9}$ meters) to about 100 microns.

Introduction

An electro-optic (EO) detector for a scanning electron microscope (or similar tool) that uses a continuous wave (CW) probe beam is basically attempting to detect single electrons using EO effect. For example, the electrons in a 1 keV nanoamp electron beam are spaced about 3 mm apart. If the detector includes an EO material about 1 mm long in the direction of the charged particle beam, only about one electron is passing by the detector at any given time.

The field for a single electron is very weak and therefore the index modulation in the EO material is very weak. According to aspects of the present disclosure, the path length over which the refractive index or probe beam polarization is modulated may be increased by directing a probe beam through the EO material more or less parallel to the direction of the nearby charged particle beam. The idea is for the frequency modulation of the probe beam to co-propagate with the charged particles. This can be implemented by incorporating the EO material into part of a waveguide-type structure. A probe beam of electromagnetic radiation (e.g., from a laser) may be coupled into a thin EO crystal slab waveguide. It is desirable to use an EO material with a large EO coefficient. By way of example, and not by way of limitation, KTaLiNbO3 has an electro-optic coefficient r33 of about 1400 pm/V. The group velocity of the probe beam in the waveguide may be matched to the charged particle velocity in the beam. By way of example, and not by way of limitation, the charged particle beam energy may be adjusted to match the group velocity. Alternatively, the cross-sectional size and/or shape of the waveguide may be adjusted to control the group velocity of the probe beam in the waveguide. In broad and general terms, the group velocity of the probe beam in the waveguide depends in a somewhat inverse manner on the broadest transverse dimension of the waveguide. A photon detector may be located at the dark port of an interferometer so that modulation of the refractive index produces a signal resulting from disturbance of a dark fringe.

According to aspects of the present disclosure, the proposed architecture for a charged particle beam sensor may include a set of one or more electromagnetic wakefield detectors placed in close proximity to a design trajectory of a non-relativistic charged particle beam, wherein the set of one or more wakefield detectors is configured to produce one or more optical signals in response to passage of the charged particle beam without interrupting the charged particle beam; and a set of one or more photon detectors configured to receive the one or more optical signals and produce one or more corresponding outputs. In some implementations, the set of one or more electromagnetic wakefield detectors is configured to implement a multi-function beam monitor that implements two or more of the following functions: beam current monitoring, beam position monitoring, beam energy spectrometry, or beam profile monitoring.

According to another aspect of the present disclosure a set of one or more electro-optic materials placed in close proximity to a charged particle beam's design trajectory. One or radiation sources and polarizer/analyzer arrangements may be configured to probe the effect on the EO material of the passage of a charged particle of the beam and its electromagnetic wake field due to the electro-optic effect. A set of one or more photon detectors that register a change of phase or polarization of the probe beam as a result of the electron affecting the electro optic material's index of refraction. The photon detector(s) may be coupled to the optics dark port of the polarizer/analyzer arrangement to detect the electron's passage.

The exact configuration and geometrical construct of the foregoing elements depends on the targeted detection application.

For higher beam current the beam density of a pulsed or CW charged particle beam could be imaged in transverse direction by passing the probe beam across two EO crystals and a gap between the crystals through which the charged particle beam passes.

According to aspects of the present disclosure an electro optic apparatus may be configured to operate as an in-line beam current monitor. In one such configuration, a pair of electro-optic crystals is placed facing a charged particle beam trajectory from opposite sides. An optical probe beam traverses both crystals and probes their refractive indexes. A polarizer-analyzer optics arrangement may be used to detect passage of charged particles through the gap between the two crystals. The arrangement of two crystals may be chosen such that the dependence of the magnitude of the electro-optic signal is minimized with the beam position.

The detected optical phase shift (either interferometric or polarization rotation) is proportional to the amount of charged particle beam current and can be deployed to cancel noise in a primary beam. This detection method is limited by the laser photon beam shot noise which can be made smaller than the charged particle beam shot noise if the number of photons per detection event is greater than the number of charged particles per detection event. Therefore this could provide for a noise cancellation method for the electron beam shot noise, and allow for throughput increase (less electron per pixel required since primary beam current is now measured).

According to another aspect of the present disclosure an electro optic apparatus may be configured to operate as a beam-position monitor (BPM). Signals of electro-optic rotation occurring in the EO materials on either side of a vacuum gap through which the charged particle beam passes are read separately in each material and subtracted. The resulting signal is linearly dependent to the charged particle beam's position relative to the two crystals. Hence the processed signal corresponds to the position of the beam centroid. The sum of the signals on the other hand would also provide a beam current reading. By using pairs of crystals oriented along the x and the y directions, the position of the center of the charged particle beam can be read without stopping the beam.

According to another aspect of the present disclosure an electro optic apparatus may be configured to operate as a beam profile monitor. In one such configuration, the charged particle beam traverses a gap between two EO crystals in one direction and a collimated optical probe beam travels through both crystals and across the gap in an orthogonal direction. The collimated probe beam is transported to a detector array in a way that images the face of one of the EO crystals onto a detector array (e.g., in a polarizer-analyzer mode and in the dark-port configuration). The beam current density near the crystal face generates a spatially dependent polarization rotation proportional to the beam current density. This spatially dependent polarization rotation at the crystal face is the imaged onto the photo-detector array. To allow for a shallow depth-of-focus for the probe beam and to image the beam profile a quadrupole (line-focusing) beam transport scheme may be used for the charged particle beam.

According to another aspect of the present disclosure an electro optic apparatus may be configured to operate as an energy spectrometer. In one such configuration, beam current monitoring performed at a dispersive plane (like a chicane) yields the beam's energy spectrum, and if there is beam energy jitter a monitor constructed from this reading could serve as a servo signal to beam control electronics to stabilize the beam energy. If it is required to match the group velocity of the EO waveguides to the electron velocity, and the waveguides have fixed physical dimensions, the energy spectrometer may only permit one waveguide design per beam velocity. In such a case, the energy spectrometer may utilize a multi-waveguide arrangement similar to the X-Y arrangement containing several waveguides of different dimensions to accommodate different group velocities.

According to another aspect of the present disclosure an electro optic apparatus may be configured to operate as discussed above for a beam of electrons or for any other charged-particle beam (e.g. ions, muons, positrons).

In some alternative implementations of the method, other possible pseudo-nonradiative schemes involve formation of an image-charge of the free electron by a nearby set of conductive plates (a classical beam-position monitor or BPM). The current pulse generated from the image charge is very small compared to the beam current being monitored, but the pulse may be detected with sufficient electronic amplification has to be amplified electronically.

With this new measurement method, the electron beam is not destroyed. As a result, the method can provide for beam servo mechanisms that don't affect duty cycle, improving throughput. Additionally, applications of this method in noise cancellation and corresponding signal-to-noise for the acquired image are the main impetus for this IP application. This method allows for the possibility of signal-to-noise improvement without altering the fundamental architecture of an existing SEM platform. As a result, and with an EO detection scheme sensitive enough to detect single electrons, application of shot noise cancellation and for a given beam current at the image plane a corresponding improvement in the signal to noise. Alternatively, the SIN could be kept fixed and the beam dose per pixel could be dropped, resulting in the possibility of higher throughput and better resolution from lower beam current (lower Coulomb interaction, aberration from larger NA beams, etc.).

EXAMPLES

FIG. 1 illustrates the basic concept behind an electro optic device as used in accordance with aspects of the present disclosure. In an electro optic (EO) device, the optical properties of a material change in response to a change in electric field in the material. Since charged particles, such as electrons produce electric fields, electro optic materials can be used to detect electrons in a continuous beam, as in a scanning electron microscope (SEM).

Specifically, as seen in FIG. 1, an electron e carries with it an electromagnetic field E that interacts with the nearby electro optic material EOM. For a linear electro-optic material its index of refraction experiences a change that is linear with the electric field component of the electron's retarded field. This effect is commonly referred to as the Pockels effect. A beam of radiation R (e.g., a laser beam) traversing an electro optic material experiences a phase change (optical retardation) due to the change in the index of refraction resulting from the electric field of a passing charged particle beam. The phase change is proportional to the electric field, which is in turn proportional to the charge or current in the particle beam. Aspects of the present disclosure relate to detection of the passage of as little as a single free nonrelativistic electron by detecting the phase change of a probe laser beam traversing an electro optic medium in close proximity to a charged particle beam.

The index of refraction $n_{ij}(\vec{E})$ is given by:

$$n_{ij}(\vec{E}) = n_{ij}(0) - \frac{1}{2}\sum_{k=1}^{3} n_{ij}^3 r_{ijk} E_k$$

The phase change is given by:

$$\phi_{ij} = \frac{\pi}{\lambda}\sum_{k=1}^{3} n_{ij}^3 r_{ijk} \int_{x1}^{x2} E_k(x') dx'$$

Figure 2:
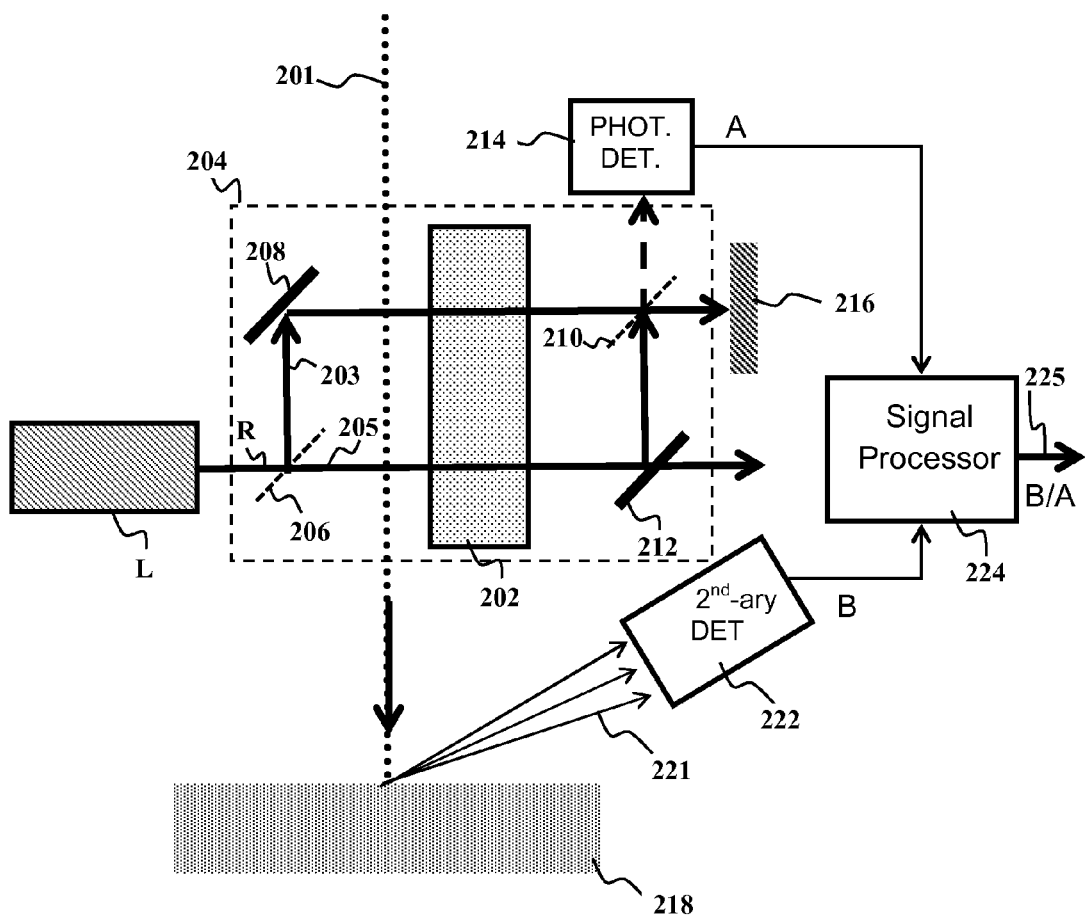
FIG. 2 depicts an electron optic charged particle beam detector implemented using an interferometer set-up according to an aspect of the present disclosure.

Electro optic materials have been used to measure beam pulses in charged particle accelerators. FIG. 2 schematically illustrates a type of apparatus 200 used for such purposes. In the apparatus 200, an EO medium 202 is placed alongside a path of a charged particle beam 201. A beam of radiation R from a laser L is split into a reference beam 203 and a probe beam 205 in a Mach-Zehnder interferometer 204. The probe and reference beams pass across the EO medium 202 in a direction perpendicular to the direction of travel of the charged particle beam 201. The reference beam 203 follows a path from the first beam splitter 206 to a first mirror 208 and from the first mirror to a second beam splitter 210. The probe beam 205 follows a path from the first beam splitter 206 to a second mirror 212 and from the second mirror to the second beam splitter 210 where light from the reference and probe beams recombine and interfere. Part of the light is sent to an optical detector 214 located at a dark port and part of the light travels to a beam dump 216 at a bright port. The interferometer 204 is aligned so that a dark interference fringe is present at the dark port in the absence of a phase disturbance difference between the reference and probe beams. A pulse of charged particles from the beam 201 passing near the probe beam causes a phase disturbance due to the electro optic effect in the EO medium 202. The phase disturbance is registered by the optical detector 214, which produces a beam signal A that is proportional to the input beam charge or current.

The beam of charged particles 201 strikes a target 218 producing secondary particles 221, which could be, e.g., secondary electrons, backscattered particles from the beam, secondary ions, Auger electrons, or X-rays. The secondary particles 221 are detected by a secondary particle detector 222 that produces a specimen signal B. The beam signal A and specimen signal B are coupled to a signal processor 224, which produces an output signal 225 that is proportional to the ratio of the specimen signal B to the beam signal A. This normalizes the specimen signal B with respect to the magnitude of the input particle beam current. Therefore, the output signal 225 is more sensitive to variations in the interaction between the charged particle beam and the target and relatively insensitive to variations in the intensity of the charged particle beam.

The arrangement shown in FIG. 2 is suitable for measurement of relatively intense pulsed charged particle beams. For example, in particle accelerators average beam currents of one ampere or more and pulse durations on the order of femtoseconds ($10^{-15}$ seconds) are common. In an electron beam at an average current one ampere, approximately $6.24 \times 10^{18}$ electrons pass a given point per second. For charged particle systems commonly used for materials characterization in the semiconductor industry, e.g., SEM systems, Auger electron spectroscopy systems and energy dispersive X-ray spectroscopy (EDX) systems, the beam currents are continuous and much smaller (e.g., of order $10^{-9}$ amperes). Such low currents typically involve the passage of a relatively small number of charged particles over the time scales of interest. For sufficiently low currents, the variation in beam current is dominated by shot noise, which results from statistical variation due to the discrete nature of the charged particles in the beam 201. For example, if the electronic circuitry of the secondary particle detector 222 operates on time scales of less than a nanosecond and if the average current in the beam 201 is 16 nanoamps, only about 100 electrons strike the target 218 every nanosecond. According to Poisson statistics the actual number of electrons in any nanosecond could vary by about 10 electrons rms. When such a small current is observed over such a time scale the shot noise amounts to 1/10 of the average beam current.

Figure 3:
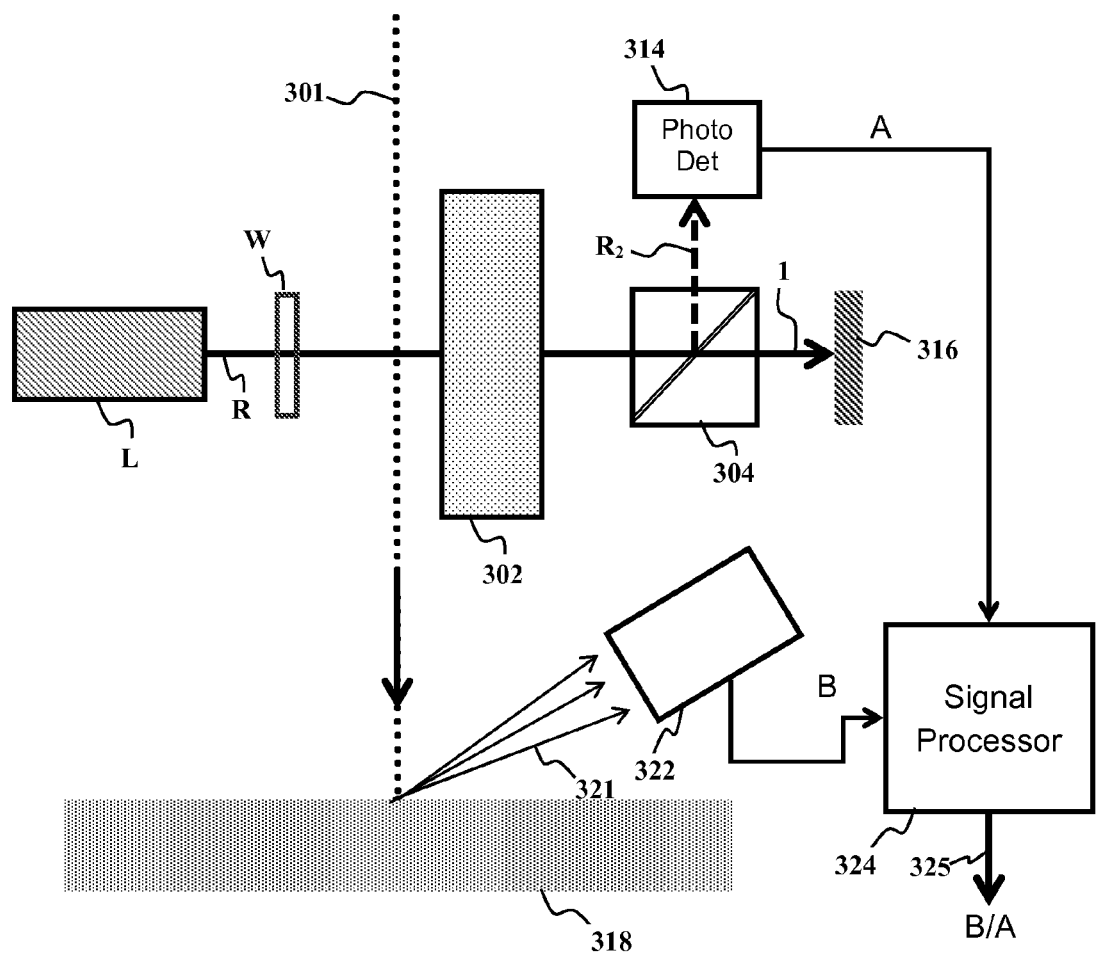
FIG. 3 depicts an electron optic charged particle beam detector implemented using polarization rotation for noise-cancellation according to an aspect of the present disclosure.

According to an aspect of the present disclosure, an alternative apparatus based on electro optics principles may be used to account for the effects of shot noise at low beam currents in charged particle beam systems. As seen in FIG. 3, an alternative apparatus 300 includes a light source L (e.g., a laser), an electro optic material 302, a polarizing beamsplitter 304, and an optical detector 314. The laser L produces a polarized beam of radiation R. The polarization direction can be adjusted by passing the radiation R through a retardation waveplate W before the radiation passes through the electro optic material 302 in a direction perpendicular to a charged particle beam 301. The polarizing beamsplitter 304 (e.g., a Glan-Thompson prism or other polarizing beam-splitter) then splits the radiation R into two beams $R_1$, $R_2$ of different polarizations, which are usually mutually orthogonal. Radiation $R_1$ having the initial polarization (i.e., the polarization of the radiation R prior to entering the EO material 302) passes through the polarizing beamsplitter to a beam dump 316. Radiation $R_2$ having a polarization orthogonal to that of the initial polarization is reflected toward the optical detector 314. The apparatus 300 is initially configured such that, in the absence of the charged particle beam 301, the EO material does not modulate the polarization of the radiation R and therefore there is no radiation $R_2$ of an orthogonal polarization to reach the optical detector 314. In other words, the optical detector 314 is at a dark port and the detector signal is nominally zero (or some other fixed value) in the absence of the beam 301.

When the beam 301 passes near the EO material 302, the electric field from the charged particles in the beam induce an electro optic effect in the EO material that causes a change in the polarization of the radiation R that emerges from the EO material. The amount of change in polarization depends on the electric field in the EO material 302, which, in turn, depends on the average current in the beam 301 over a time scale of interest. The change in polarization causes some of the radiation $R_2$ to be directed toward the optical detector 314, which generates a beam signal A as a result. The beam signal A is proportional to the average current in the charged particle beam 301. By way of example, and not by way of limitation, the optical detector 314 may be a standard silicon based photodetector, a photomultiplier tube (PMT) or a multi-channel plate (MCP).

When the charged particle beam 301 strikes a target 318, secondary particles 321 are produced, e.g., secondary electrons, backscattered particles from the beam, secondary ions, Auger electrons, or X-rays. The secondary particles 321 are detected by a secondary particle detector 322, which produces a specimen signal B, as a result. By way of example, the secondary particle detector 322 may be a PIN diode detector or a scintillator combined with an MCP or PMT. The beam signal A and specimen signal B are coupled to a signal processor 324, which produces an output signal 325 that is proportional to the ratio of the specimen signal B to the beam signal A. This normalizes the specimen signal B with respect to the magnitude of the average current in the charged particle beam 301. Therefore, the output signal 325 is more sensitive to variations in the interaction between the charged particle beam and the target and relatively insensitive to variations in the intensity of the charged particle beam 301 due to shot noise. By way of example, and not by way of limitation, the functions of the signal processor 324 may be implemented in software, e.g., by executable instructions implemented on a general-purpose computer or in hardware, e.g., by a programmable circuit, such as an Application Specific Integrated Circuit (ASIC) or a Field Programmable Gate Array (FPGA).

In the interferometer shown in FIG. 2 the probe beam and reference beam pass through the electro optic material in a direction perpendicular to the direction of a charged particle beam 201. Although this may work for large beam currents, as in particle accelerators, the beam signal A may be too small to be useful for low beam current applications, such as SEM. The reason for this may be understood by referring to FIG. 4.

Figure 4A:
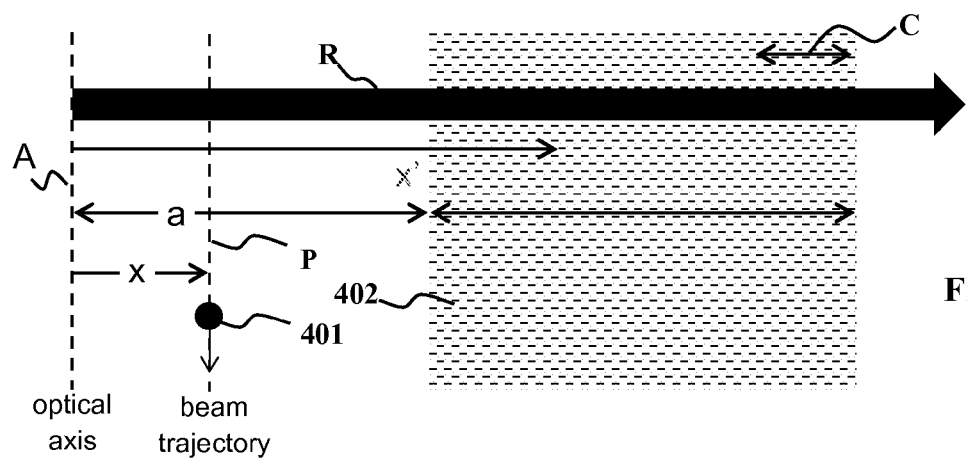
FIG. 4A shows a bulk EO material being probed by a laser beam directed perpendicular to a charged particle beam to measure the effect of a passing single charged particle.

In FIG. 4A a charged particle beam 401 follows a path P parallel to an optical axis A proximate an electro optic (EO) material 402. The charged particle path is at a distance x from the axis A and a nearby surface of the EO material 402 is at a distance a from the axis. A beam of laser radiation R is directed across the EO material 402 perpendicular to the axis A and path P. By way of example, consider a charged particle beam 401 made up of electrons traveling in free space at non-relativistic speeds.

At an arbitrary distant x' from the axis A, the electric field $E_x(x')$ from a non-relativistic electron in free space is given by $$E_x(x') = \frac{e}{4\pi\varepsilon_0(x-x')^2},$$

where e is the charge on the electron ($1.6 \times 10^{-19}$ Coulombs) and $\varepsilon_0$ is the permittivity of free space ($8.85 \times 10^{-12}$ $C^2/N \cdot m^2$). For low currents and moderate voltage, e.g., about 1 nanoampere (nA) and about 10 kV, the electrons in the beam are sufficiently far apart that they may be treated as single point charges, as opposed to a line of charges.

For an EO material 402 in the form of a trigonal EO crystal, the refractive index $n_z(x')$ depends on the field $E_x(x')$ as follows:

$$n_z(x') = n_0 - \frac{1}{2}n_0^3 r_{51} E_x(x'),$$

where $n_0$ is the refractive index of the material for ordinary rays (i.e., rays directed along the crystal axis C of the EO material 402 shown in FIG. 4A) and $r_{51}$ is the relevant electro optic coefficient for photons traveling in the direction of the crystal axis C.

For radiation R of vacuum wavelength λ, the accumulated phase change φ is given by $$\phi = \frac{2\pi}{\lambda} \int_a^\infty (n_z(x') - n_0) dx'$$
$$= -\int_a^\infty \frac{n_0^3 r_{51} e}{4\lambda\varepsilon_0(x'-x)^2} dx'$$
$$= \frac{n_0^3 r_{51} e}{4\lambda\varepsilon_0(x-a)}.$$

By way of numerical example, assume that the EO material is Potassium Tantalum Lithium Niobate (KTaLiNbO$_3$), for which $r_{51}$=42 pm/V and $r_{33}$=1400 pm/V, $n_0$=2.312, $n_e$=2.273. Further assume a=5 μm, λ=532 nm. The phase shift induced by a single free electron is therefore ~0.8 μrad Also assume monitoring of the dark port, where $I_{dark}$~$\phi^2$ $I_{laser}$ and $P_{laser}$=10 W, or 5×10$^4$ photons/optical cycle and the laser has a beam waist $\omega_0$=5 μm. For a 10 keV electron (υ~0.2c) the transit time is ~8 fs or about 4.5 optical cycles. This equates to ~1.4×10−7 signal photons per electron event. The effect is therefore probably too small to detect single electrons with a CW laser beam.

Figure 4B:
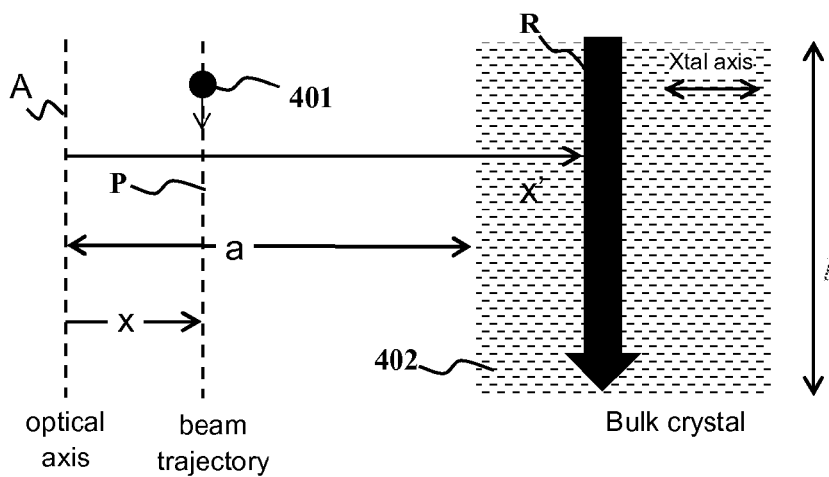
FIG. 4B shows a laser propagating along an EO material parallel to a charged particle beam according to an aspect of the present disclosure.

According to certain aspects of the present disclosure, however, the signal may be increased dramatically if the laser radiation R is directed along the surface of the EO material closest to the charged particle beam 401 in a direction more or less parallel to the direction of travel of the charged particles that make up the beam. FIG. 4B schematically illustrates an arrangement similar to that shown in FIG. 4A, except that the laser beam radiation R is directed along the surface of the EO medium 402 along a direction parallel to the direction of travel of the charged particle beam 401. The phase change φ for the radiation R passing through the EO medium 402 in the direction shown in FIG. 4B may be calculated from the electric field for a non-relativistic charged particle and the material properties and dimensions of the EO medium.

The electric field from free non-relativistic electron is again given by:

$$E_x(x') = \frac{e}{4\pi\varepsilon_0(x-x')^2},$$

For radiation traversing a trigonal crystal perpendicular to the crystal axis C in the manner shown in FIG. 4B, the index change $n_x(x')$ is given by:

$$n_x(x') = n_e - \frac{1}{2}n_e^3 r_{33} E_x(x'),$$

where $n_0$ is the refractive index of the material for ordinary rays (i.e., rays directed perpendicular to the crystal axis C of the EO material 402 shown in FIG. 4A) and $r_{33}$ is the relevant electro optic coefficient for photons traveling in the EO material in this direction. The accumulated phase change φ is given by:

$$\phi = \frac{2\pi}{\lambda} \int_0^l (n_y(x') - n_e) dx'$$
$$= -\int_0^l \frac{n_e^3 r_{33} e}{4\lambda\varepsilon_0(x'-x)^2} dz'$$
$$= \frac{n_e^3 r_{33} e l}{4\lambda\varepsilon_0(x'-x)^2},$$

where l is the length of the EO material 402 along the path of the charged particle beam 401.

Assume again that the EO material 402 is KTaLiNbO$_3$, for which $r_{33}$=1400 pm/V, and $n_e$=2.273. By way of numerical example, assume a=5 μm, l=1 mm, λ=532 nm, $P_{laser}$=10 W, or 5×10$^4$ photons/optical cycle. Also assume monitoring of the dark port, where $I_{dark}$~$\phi^2$ $I_{laser}$ The phase shift induced by a single free electron is therefore φ~5.5 mrad. The length of the laser pulse having a maximum interaction with an electron in the beam 401 is ~2a or 10 μm. This corresponds to a transit time 2a/$v_g$~166 fsec or 62 opt. cycles, where $v_g$ is the group velocity of the radiation R in the EO material 402. This equates to about 93 signal photons per electron event. Though the effect is small, it allows for detection of single electrons with a CW laser beam.

Figure 5:
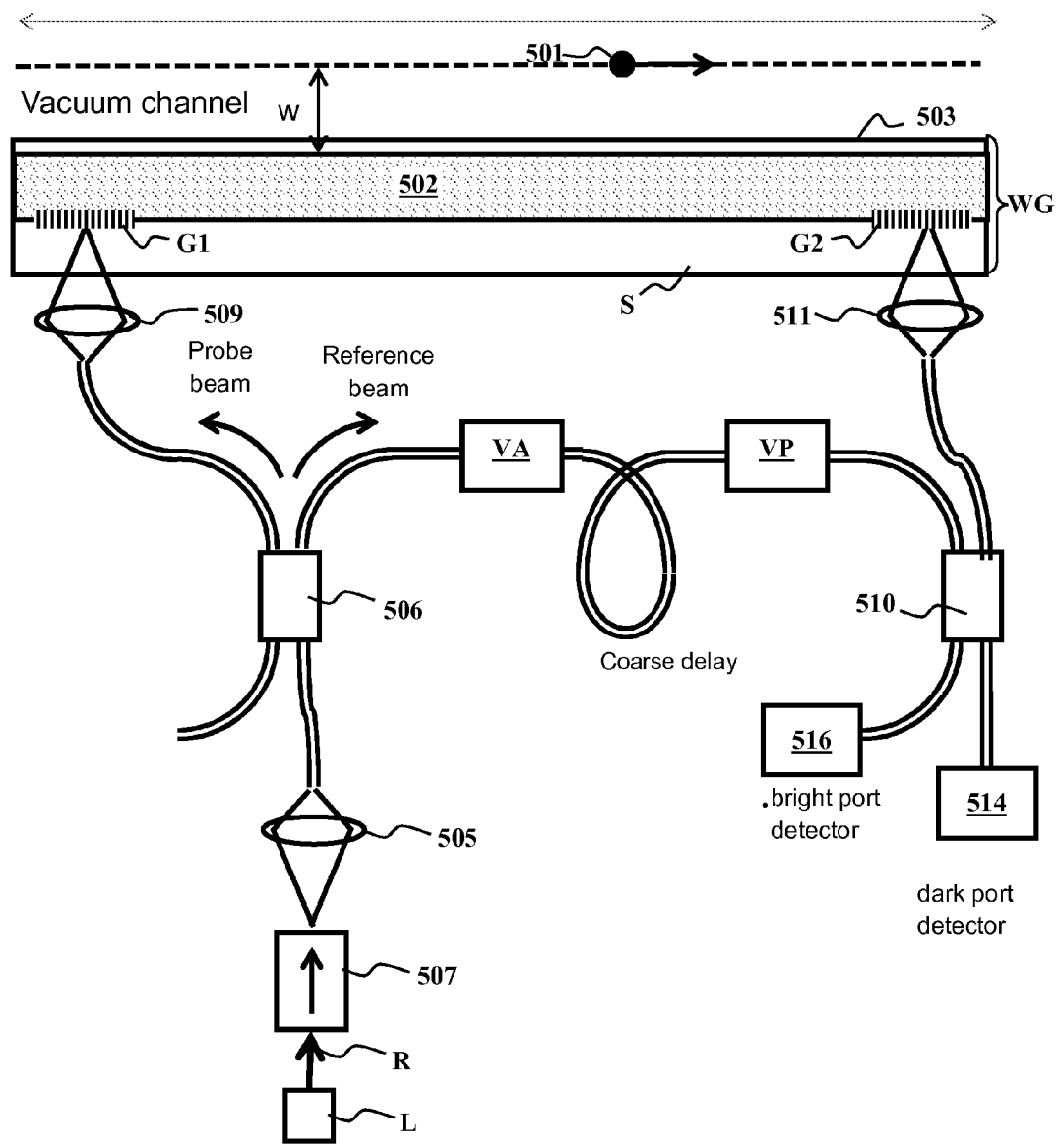
FIG. 5 is a schematic diagram of a waveguide electron detector in accordance with aspects of the present disclosure.

Aspects of the present disclosure include implementations based on the principle of operation illustrated in FIG. 4B. Specifically, FIG. 5 depicts an example of an interferometer-based charged particle beam measurement system 500 somewhat similar to the system 200 depicted in FIG. 2. In the system 500 charged particles 501 of a charged particle beam travel in a vacuum channel a distance w proximate a dielectric slab waveguide WG. The channel is wide enough to permit passage of a beam of the charged particles 501 without interrupting (e.g., clipping) it. The waveguide WG includes a slab of EO material 502 sandwiched between a substrate S that acts as a cladding and a resistive coating 503. The resistive coating 503 dissipates charge from stray charged particles that hit the walls of the EO-monitor so that electrostatic charge does not accumulate on the walls. The substrate S has a different refractive index than the EO material 502. By way of example, and not by way of limitation, the substrate S may be made of silicon dioxide (SiO$_2$) and the EO material 502 may be Potassium Tantalum Niobate (KTaNbO$_3$). The waveguide WG forms a probe arm of an interferometer, e.g., a Mach-Zehnder interferometer. In the example depicted in FIG. 5, the interferometer is implemented partly with optical fiber. Alternative implementations may use free-space optical components.

Radiation R from a source such as a laser L may be coupled into the waveguide WG using free space optics 505. By way of example, and not by way of limitation, the laser L may be a continuous wave (CW) laser that produces a beam of radiation R characterized by a vacuum wavelength of 532 nm. Commercially available examples of suitable lasers include a Verdi 20 W optically pumped semiconductor laser (OPSL)

lasers from Coherent, Inc. of Santa Clara, Calif. and 100 W fiber lasers available from IPG Photonics of Oxford, Mass.

An optical isolator 507 may be placed between the laser L and the optics 505 to prevent back coupling of radiation. A first beamsplitter 506 divides the radiation R into a probe beam that is coupled into the waveguide WG and a reference beam that is coupled into a reference arm of the interferometer. By way of example, and not by way of limitation, the probe beam may be coupled into the waveguide using a second set of free space optics 509 and a first grating coupler G1. The probe beam may be coupled out of the waveguide WG in a similar manner, e.g., using a second grating coupler G2 and a third set of free space optics 511. The probe beam travels through the EO material 502 of the waveguide WG in a direction more or less parallel to the direction of travel of the portion of the intended charged particle trajectory that is proximate the waveguide. The wavelength of the radiation R and the properties of the waveguide WG are chosen so that the group velocity of the probe beam in the EO material 502 is approximately equal to the velocity of nearby charged particles 501, to within a range of adjustment of the charged particle velocity. The charged particle velocity may be closely matched to the group velocity of the probe beam, e.g., by adjusting an appropriate voltage in the system that produces the beam of charged particles.

After the probe beam is coupled out of the waveguide WG, a second beamsplitter 510 combines the reference beam and probe beam. Part of the combined beam is coupled (e.g., by optical fiber) to a dark port detector 514 and part of the combined beam may optionally be coupled to a bright port detector 516. The reference arm may optionally include variable attenuator VA, a coarse delay (e.g., a length of optical fiber), and a variable phase control VP to optimize signal at the dark port detector 514. The variable phase control VP may use a suitable nonlinear optical material, e.g., lithium niobate (LiNbO3). Phase adjustment may be implemented by adjusting the temperature of the nonlinear optical material. Operation of the system 500 is similar to the operation of the system 200 described above, but with greater sensitivity as a result of the waveguide arrangement in the probe arm of the interferometer.

Figure 6:
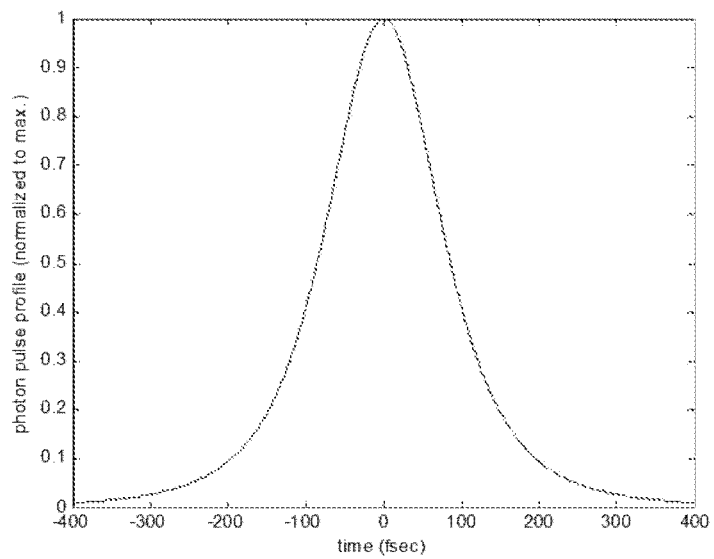
FIG. 6 is a graph depicting an expected pulse profile from detection of a single electron in a waveguide electron detector of the type shown in FIG. 5.
Figure 7:
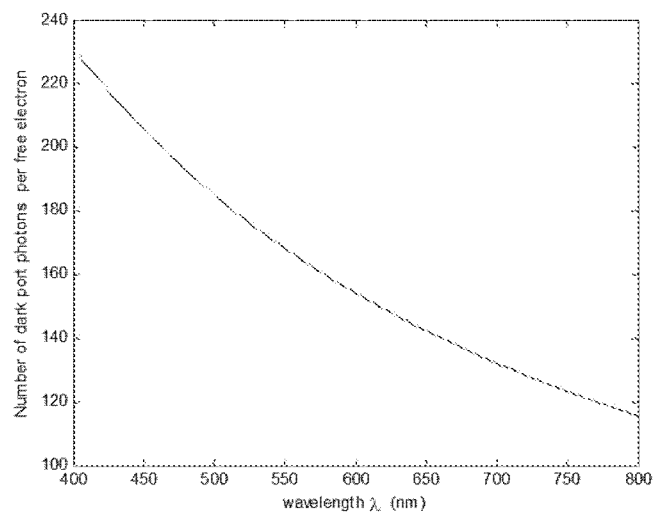
FIG. 7 is a graph plotting an expected number of dark port photons per electron detected given a certain wavelength of the probing light for a waveguide electron detector of the type shown in FIG. 5.
Figure 8:
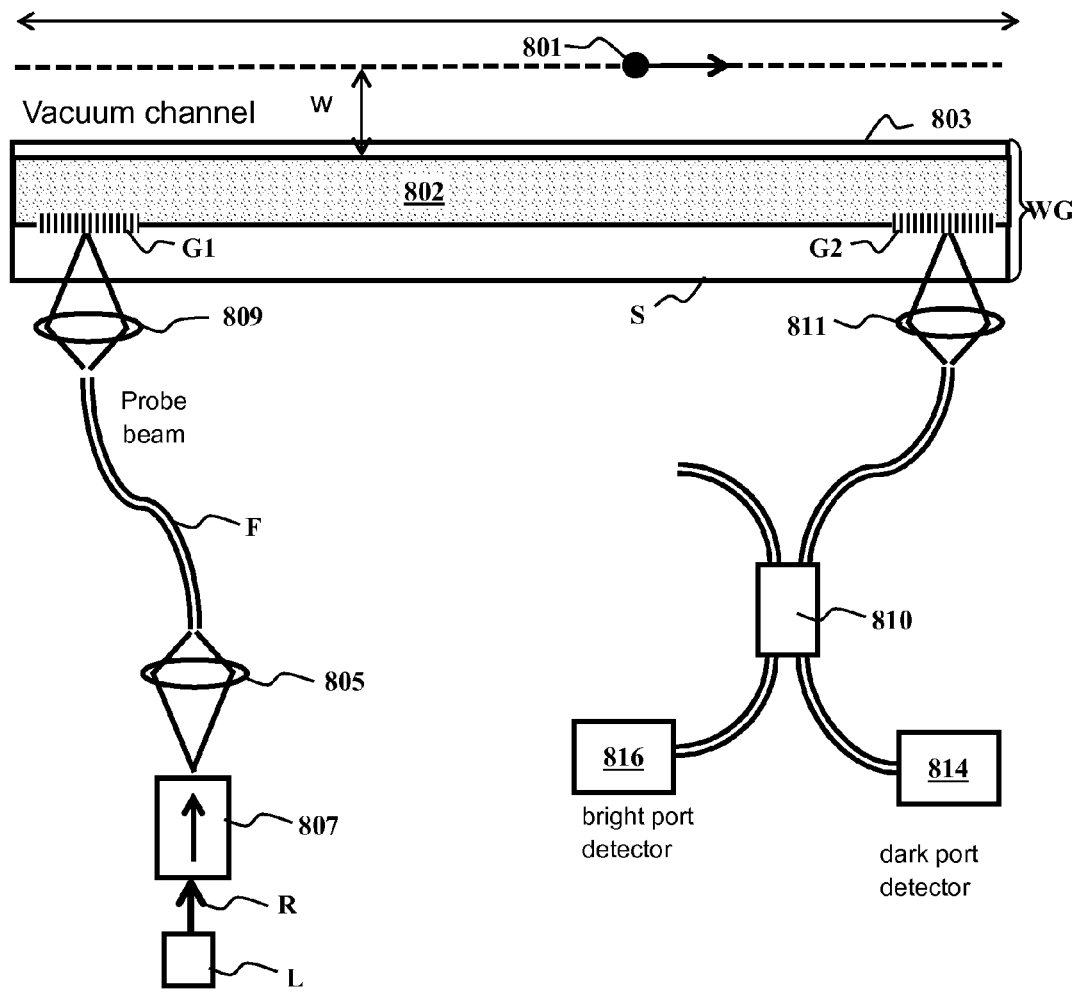
FIG. 8 is a schematic diagram of an alternative charged particle detector system in accordance with an aspect of the present disclosure.

The performance of a system of the type shown in FIG. 5 may be appreciated by referring to FIG. 6 and FIG. 7. The graph depicted in FIG. 6 shows an expected pulse profile from detection of a single electron in a waveguide electron detector of the type shown in FIG. 5. The expected pulse is about 200 fs in duration. The graph shown in FIG. 7 estimates the number of photons per electron as a function of the wavelength of the probing radiation using $KTaNbO_3$ as the EO material. From the graph, one may determine that the expected number of photons per electron at 532 nm is ~170 photons/electron The waveguide design illustrated in FIG. 5 may also be applied to the type of detector architecture depicted FIG. 3. FIG. 8 illustrates an example of such a system 800. In this system 800 a beam of charged particles 801 travels in a vacuum channel proximate a dielectric slab waveguide WG. In the waveguide WG a slab of EO material 802 is sandwiched between a substrate S that acts as a cladding and a resistive coating 803. The substrate and cladding have different refractive indices than the EO material 802, e.g., as described above with respect to FIG. 5. Radiation R from a source such as a laser L may be coupled into a polarization maintaining fiber F, e.g., using free space optics 805 and an optical isolator 807. A second set of free space optics 809 and a first grating G1 couple at least some of the radiation R into the waveguide WG as a probe beam. The incident polarization of the radiation R entering the waveguide WG may be controlled, e.g., by a waveplate W. The probe beam may be coupled out of the waveguide WG, e.g., using a second grating coupler G2 and a third set of free space optics 811. The wavelength of the radiation R and the properties of the waveguide WG may be chosen so that the group velocity of the probe beam in the EO material 802 is approximately equal to the velocity of nearby charged particles 801, to within a range of adjustment of the charged particle velocity. The charged particle velocity may be closely matched to the group velocity of the probe beam, e.g., by adjusting an appropriate voltage in the system that produces the beam of charged particles.

As the probe beam travels through the EO material 802 of the waveguide WG in a direction more or less parallel to the direction of travel of the portion of the intended charged particle trajectory that is proximate the waveguide EO interaction between the probe beam and charged particles 801 cause a change of polarization of the probe beam.

After the probe beam is coupled out of the waveguide WG, a polarizing beamsplitter 810 directs probe beam radiation having a polarization orthogonal to the initial polarization to a dark port detector 814. Probe beam radiation having the same polarization as the incident polarization may be coupled to a bright port detector 816. combines the reference beam and probe beam. Operation of the system 800 is similar to the operation of the system 300 described above with respect to FIG. 3, but with greater sensitivity as a result of the waveguide arrangement in which the probe radiation travels parallel to the charged particles and at a group velocity that matches the velocity of the charged particles.

Figure 9A:
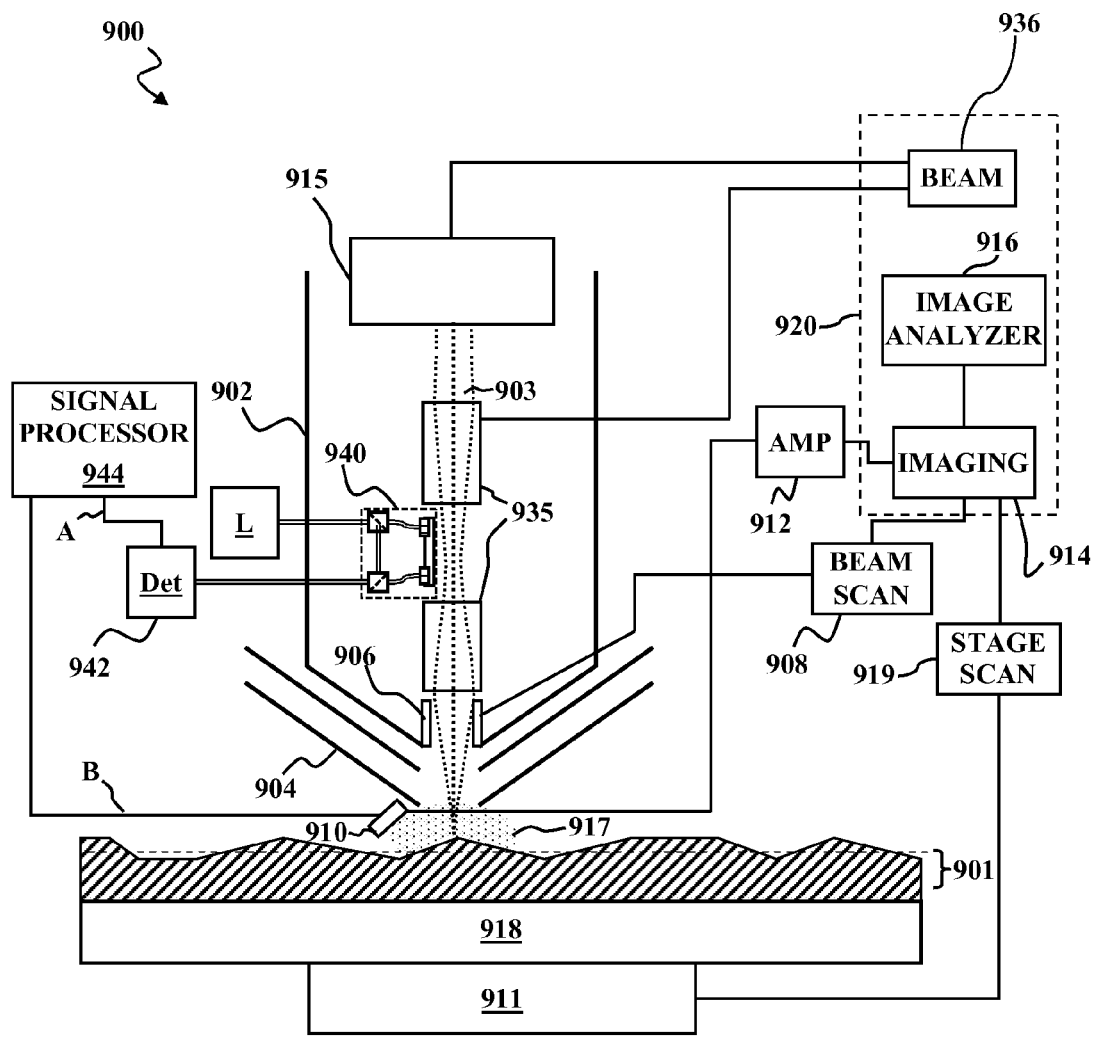
FIG. 9A is a schematic diagram of a charged particle beam system in accordance with an aspect of the present disclosure.
Figure 9B:
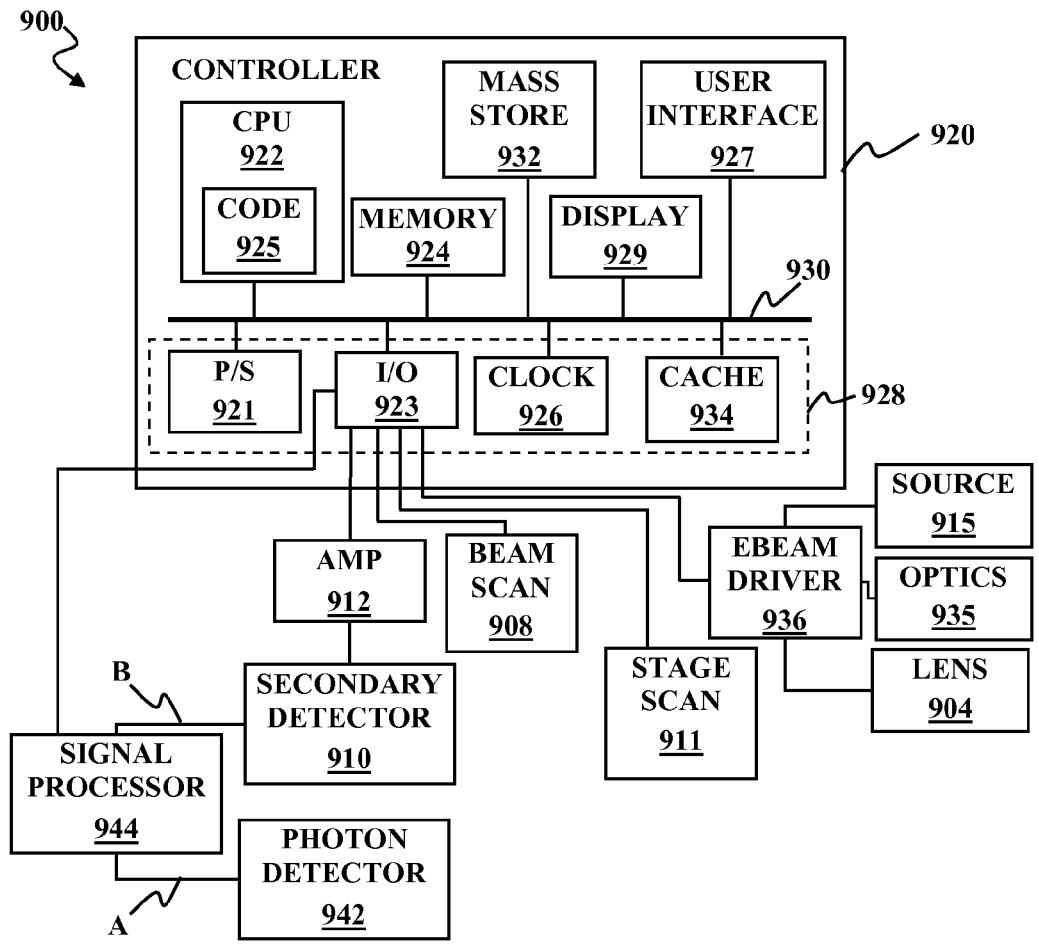
FIG. 9B is a block diagram of the charged particle beacon system of FIG. 9A.

FIG. 9A and FIG. 9B illustrate an example of a charged particle beam system 900 that incorporates certain aspects of the present disclosure. In this non-limiting example, the system 900 is configured as a scanning electron microscope (SEM) having charged particle optical column 902 with an electron source 915, beam optics elements 935, an immersion lens 904, which may be an electrostatic or magnetic lens. The optical column 902 may be controlled by electronics 936, referred to herein as a beam driver. The beam driver 936 may control the electron source 915, beam optics elements 935 and immersion lens 904. In this example, the beam optics 935 include two or more electrically conductive cylinders maintained at voltages that produce electric fields to extract electrons from the source 915 and form them into a primary beam 903 that travels in the direction of a target 901. The immersion lens 904 focuses the primary beam into a narrow spot at the surface of the target.

A electro optic beam detection apparatus 940 is placed proximate a waist of the primary beam 903, e.g., between the elements of the beam optics 935. By way of example, and not by way of limitation, the apparatus 940 may include an interferometer of the type shown in FIG. 5 in which the probe arm includes an optical waveguide formed in a slab of electro optical material proximate the beam waist. A laser L may provide the probe beam and reference beam to the apparatus 940. The probe beam travels in the waveguide more or less parallel to the primary beam 903 and is combined with the reference beam. The combined beam is coupled to a photon detector 942, which may be coupled to a dark port of the apparatus 940. In such a case, the photon detector 942 produces a signal A that is proportional to the dark port interference signal of the interferometer.

In alternative implementations, the apparatus 940 may include a polarization sensing apparatus of the type illustrated in FIG. 8. Furthermore, aspects of the present disclosure include implementations in which two or more EO detector apparatus 940 are placed proximate the primary beam 903, for reasons discussed below.

Electrons from the electron beam column 902 are focused onto a surface of the target 901, which may be an integrated circuit wafer or a test wafer. The target 901 is supported by a stage 918. The electrons may be scanned across the surface of the target 901, e.g., by deflecting fields provided by one or more electrostatic deflector plates 906. Voltages are provided to the deflector plates 906 via a beam scanner driver 908. In some implementations, the beam scanner driver 908 may apply currents to magnetic coils to scan the electron beam across the target 901. Alternatively, the stage 918 may include a stage scanning mechanism 911 and stage scanner driver 919 configured to move the target along X-Y plane parallel to the surface of the target 901 in one or more directions relative to the optical column 902. In some implementations the stage scanning mechanism 911 and stage scanner driver 919 may move the stage in one direction (e.g., the X direction) as the beam scanner driver 908 scans the beam in a different direction (e.g., the Y direction). Alternatively, the stage scanner driver 919 may drive the stage in both the X and Y directions relative to the optical column 902 to scan the beam across the target while the beam remains fixed relative to the optical column.

Electrons striking the target 901 are either backscattered or initiate secondary emission. The electron beam column collects a portion of such backscattered or secondary electrons 917 (or other secondary particles) that emerge from the surface of the target 901. The collected electrons 917 impinge on a secondary particle detector 910, which generates a secondary signal B that is proportional to the amount of backscattering or secondary emission. The signal may be amplified by an amplifier 912. The amplified signal and a signal from the beam scanner driver 908 and/or stage scanner driver 919 are combined by an image generator 914 to produce a magnified image of the surface of the target 901. Images generated by the image generator 914 may be analyzed by the image analyzer 916, e.g., to determine a measure of quality of the modified surface or shape and size of resulting formed structures.

In accordance with aspects of the disclosure, the secondary signal B from the secondary particle detector 910 (or amplifier 912) and the photon signal A from the photon detector 942 may be coupled to a signal processor 944 to cancel out the effect of noise in the primary beam 903. By way of example, and not by way of limitation, the signal processor 944 may produce an output proportional to a ratio of the secondary particle signal B to the photon signal A.

In alternative implementations, sources of energetic particles other than electrons (e.g., ions, neutrons, ultraviolet radiation, or X-rays) may be used as alternatives to the electron source 915, depending on the nature of the system. In addition, the energetic particle source may be separate from and/or located outside of the charged particle optical column 902. For example, in X-ray photoelectron spectroscopy (XPS) the primary energetic particles may be X-rays that initiate emission of secondary electrons from the target. In ultraviolet photoelectron spectroscopy (UPS) the primary energetic particles may be ultraviolet photons that similarly initiate emission of secondary electrons from the target. Also, in alternative implementations, other types of charged particles (e.g., positive or negative ions) may backscatter from or be emitted by the target and pass back up through the optical column 902 to impinge on the secondary particle detector 910. For example, in secondary ion mass spectroscopy (SIMS) the primary particles are energetic ions and the secondary charged particles are ionized atoms of the target material that are knocked off of the target as a result of energetic impact by the primary ions.

Some charged particle systems include a charged particle energy analyzer (e.g., a cylindrical mirror analyzer, Bessel box, parallel plate analyzer) as part of the optical column 902 between the immersion lens 904 and the secondary particle detector 910. Such spectrometers are used for energy selection of secondary electrons, e.g., as in Auger electron spectroscopy (AES) for chemical analysis of the target 901. Other systems include a mass spectrometer (e.g., a magnetic sector, RF quadrupole, or Wien filter to select secondary charged particles by mass, e.g., as in SIMS systems.

By way of example, and not by way of limitation, images may be generated by driving the beam scanner in a raster pattern in which the primary beam scans across the sample 901 in one direction with the beam scanner driver 908 and beam deflector plates 906 (or scanner coils) and the detector signal as a function of beam position is converted into a line of the image as is well known in the art. At an end of the scan of the beam in one direction (e.g., the X-direction), the beam location may be adjusted by a small amount (e.g., an amount comparable to a size of the beam spot on the sample) in a different direction (e.g., the Y-direction) and another scan may be performed to generate another line of the image. By repeating this process an image of part of the sample may be generated.

In alternative implementations, images may be generated by scanning the primary beam across the sample 901 in one direction (e.g., the X-direction) and converting the detector signal as a function of beam position into a line of the image. The stage scanner driver 919 and stage scanning mechanism may translate the sample 901 by a small amount in a different direction (e.g., the Y-direction) at the end of each line scan.

Secondary detector 910 may be a diode device with a junction and depletion region. By way of example and not by way of limitation, detector 910 can be a PN junction, a PIN junction. In alternative implementations, the detector 910 may be a CMOS detector (e.g., CCD), silicon-based or III-V detector, multi-channel plate, photodiode array, avalanche photodiode and/or Schottky diode. In one example, the detector 910 is PN junction diode that includes a positively doped P region and a negatively doped N region. A depletion region, an area of neutral charge, exists between the P and N regions. When a photon enters the device, electrons in the crystalline structure become excited. If the energy of the photon is greater than the bandgap energy of the material, electrons will move into the conduction band crating holes in the valence band where the electrons were. These electron-hole pairs are created throughout the device. Those generated in the depletion region drift to their respective electrons. This results in a positive charge buildup in the P layer and a negative one in the N layer. The amount of charge is directly proportional to the amount of light falling on the detector.

It should be noted that in addition to SEM systems, many other charged particle systems may employ the secondary charged particle detection device according to the present disclosure. Examples of systems may include, but are not limited to, systems configured to implement focused ion beam (FIB), ultraviolet photoelectron spectroscopy (UPS), X-ray photoelectron spectroscopy (XPS), Auger electron spectroscopy (AES), and Secondary Ion Mass Spectroscopy (SIMS).

As shown in the block diagram of FIG. 9B, the image generator 914 and image analyzer may be part of a controller 920. The controller 920 may be a self-contained microcontroller. Alternatively, the controller 920 may be a general purpose computer configured to include a central processor unit (CPU) 922, memory 924 (e.g., RAM, DRAM, ROM, and the like) and well-known support circuits 928 such as power supplies 921, input/output (I/O) functions 923, clock 926, cache 934, and the like, coupled to a control system bus 930. The memory 924 may contain instructions that the CPU 922 executes to facilitate the performance of the system 900. The instructions in the memory 924 may be in the form of the program code 925. The code 925 may control, e.g., the electron beam voltage and current produced by the source 915, the focusing of the beam with the beam optics 935 and the immersion lens 904, the scanning of the electron beam by the coils 906, the scanning of the stage 918 by the stage scanner 911 and the formation of images with the signal from the detector 110 in a conventional fashion. The code 925 may also implement analysis of the images.

The code 925 may conform to any one of a number of different programming languages such as Assembly, C++, JAVA or a number of other languages. The controller 920 may also include an optional mass storage device, 932, e.g., CD-ROM hard disk and/or removable storage, flash memory, and the like, which may be coupled to the control system bus 930. The controller 920 may optionally include a user interface 927, such as a keyboard, mouse, or light pen, coupled to the CPU 922 to provide for the receipt of inputs from an operator (not shown). The controller 920 may also optionally include a display unit 929 to provide information to the operator in the form of graphical displays and/or alphanumeric characters under control of the processor unit 922. The display unit 929 may be, e.g., a cathode ray tube (CRT) or flat screen monitor.

The controller 920 may exchange signals with the imaging device scanner driver 908, the e-beam driver 935 and the detector 910 or amplifier 912 through the I/O functions 923 in response to data and program code instructions stored and retrieved by the memory 924. Depending on the configuration or selection of controller 920, the scanner driver 908, detector 910, amplifier 912, photon detector 942, and/or signal processor 944 may interface with the I/O functions 923 via conditioning circuits. The conditioning circuits may be implemented in hardware or software form, e.g., within code 925. Also, in some implementations, the functions of the signal processor 944 may be implemented in software within the code 925.

Figure 9C:
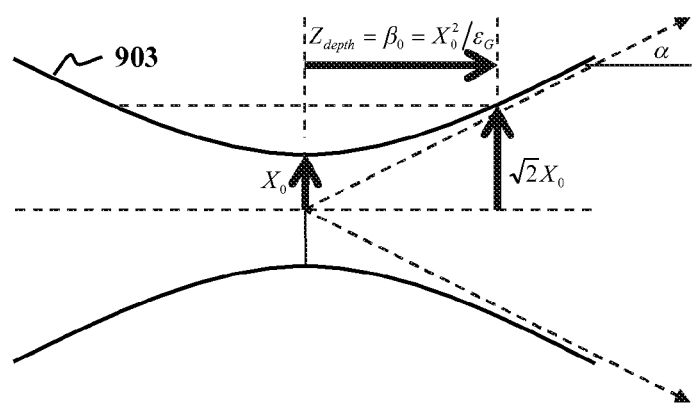
FIG. 9C illustrates a numerical example for determining the aperture size and the waveguide and the length of the waveguide for a given beam geometry in an axial plane in accordance with an aspect of the present disclosure.

It is desirable that the EO waveguide of the EO detector 940 be placed as close as possible to the beam waist in the primary beam 903 without clipping the beam. FIG. 9C illustrates a numerical example for determining the aperture size and the waveguide and the length of the waveguide for a given beam geometry in an axial plane. The numerical example assumes a 10 kV primary electron beam 903 with reduced brightness of $10^8$ A/m²/sr/V, and 10 nA beam current.

The normalized transverse emittance of the beam $\varepsilon_N$ is given by:

$$\varepsilon_N = \sqrt{\frac{I}{B_r} \times \left(\frac{2e}{\pi^2 m_e c^2}\right)} \sim 6.3 \times 10^{-4} \sqrt{I/B_r} \sim 6.3 \times 10^{-12} m\text{-rad}$$

The geometric transverse beam emittance is $$\varepsilon_G = \frac{\varepsilon_N}{\beta_y} \sim 3.5 \times 10^{-11} m\text{-rad}$$

The growth of the beam beta function with drift down the z-axis (focus at z=0) is $\beta(z) = \beta_0 + z^2/\beta_0$ Growth of the beam envelope in the transverse (X) direction as a function of axial position z follows the following equation $X(z) = \sqrt{\varepsilon_G \beta(z)} = X_0 \sqrt{1 + (\varepsilon_G^2/X_0^2) \times z^2/X_0^2}$ The depth of focus is $Z_{depth} \equiv \beta^* = X_0^2/\varepsilon_G$ The divergence angle is $\alpha = \varepsilon_G/X_0$ For a $X_0 = 1$ μm focus $\beta^* = 28$ mm and a=35 μrad.

Hence a waveguide 1 mm long and 10 μm aperture will not interfere with (clip) the primary beam 903 in this example.

Figure 10A:
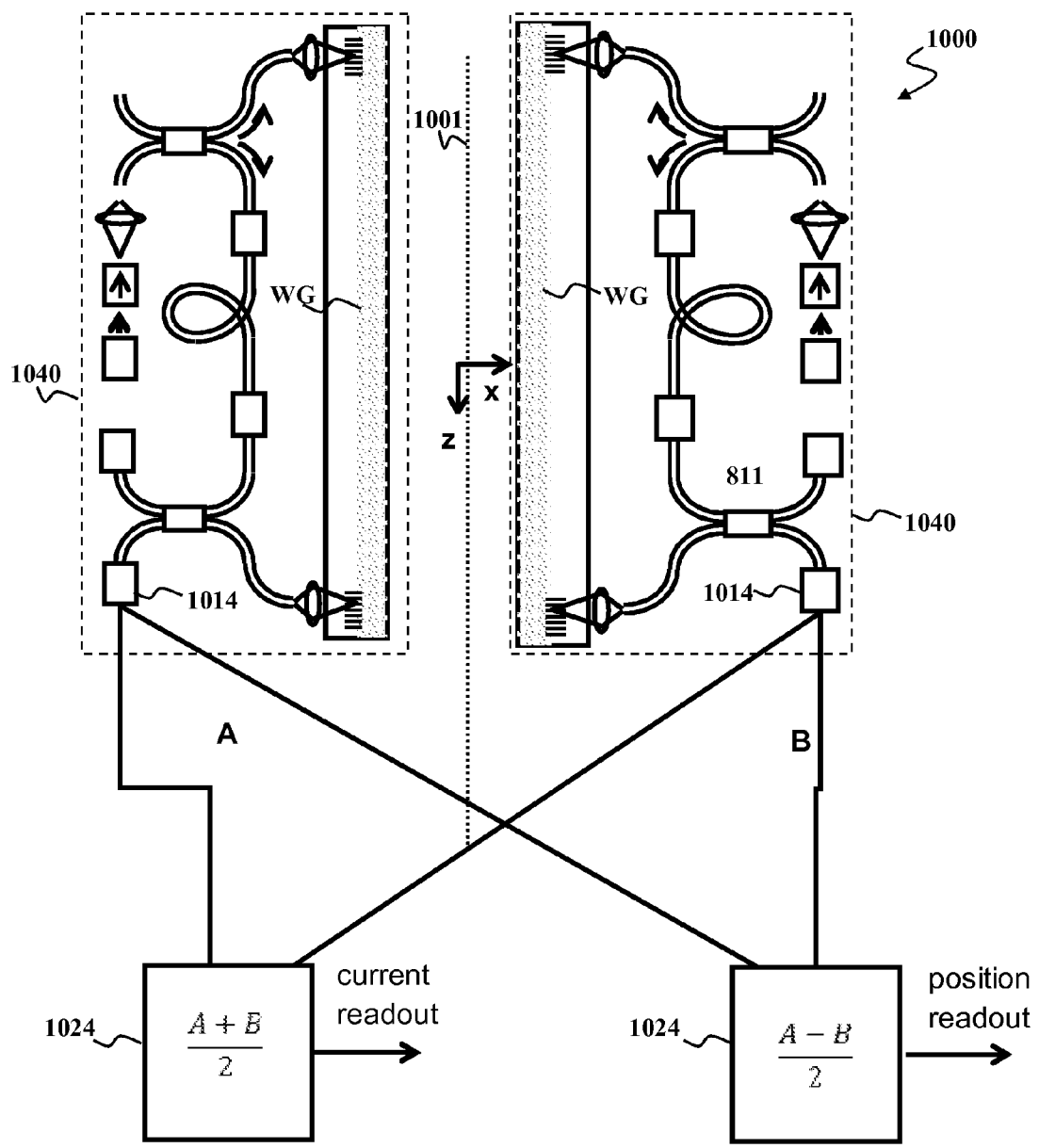
FIGS. 10A-10B illustrate a beam position monitor in accordance with an aspect of the present disclosure.

As mentioned above, there are a number of different configurations for the EO detector 940. A few of this are described below with respect to FIG. 10A and FIG. 10B and FIG. 11 though FIG. 13. FIG. 10A shows a top down view of an apparatus 1000 in which a pair of interferometer EO detectors 1040 of the type shown in FIG. 5 are configured to detect the x-axis position of the center of a charged particle beam 1001 traveling parallel to the z-axis direction. In an alternative implementation, the EO detectors 1040 may be polarization detectors of the type shown in FIG. 8. Each EO detector 1040 includes an EO waveguide WG oriented parallel to a path of the beam 1001. The two waveguides are separated by a gap through which the beam 1001 can pass. Photon detectors 1014 are coupled to the dark ports of the EO detectors 1040 (or polarization detectors). Signals from the photon detectors 1014 may be coupled to signal processors 1024. A sum of the signals from the left and right photon detectors is proportional to the beam current. A difference between the signals from the left and right photon detectors is proportional to the position of the center of the beam 1001 along to the x-axis. This difference may be calibrated to be zero when the beam is perfectly centered.

Figure 10B:
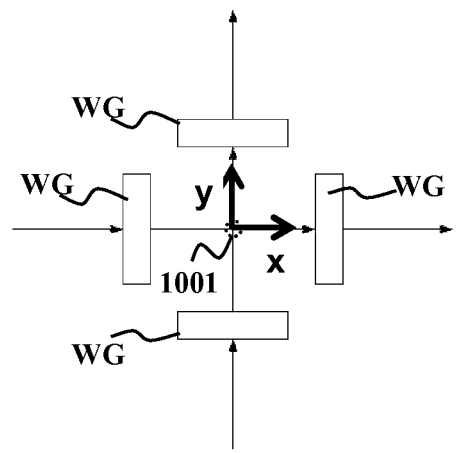

As shown in FIG. 10B, the apparatus 1000 may optionally include a second pair of EO waveguide detectors 1040 with their waveguides WG oriented to sense the position of the center of the beam 1001 relative to the y-axis. In FIG. 10B, the Z-direction is directed out of the plane of the drawing.

Figure 11:
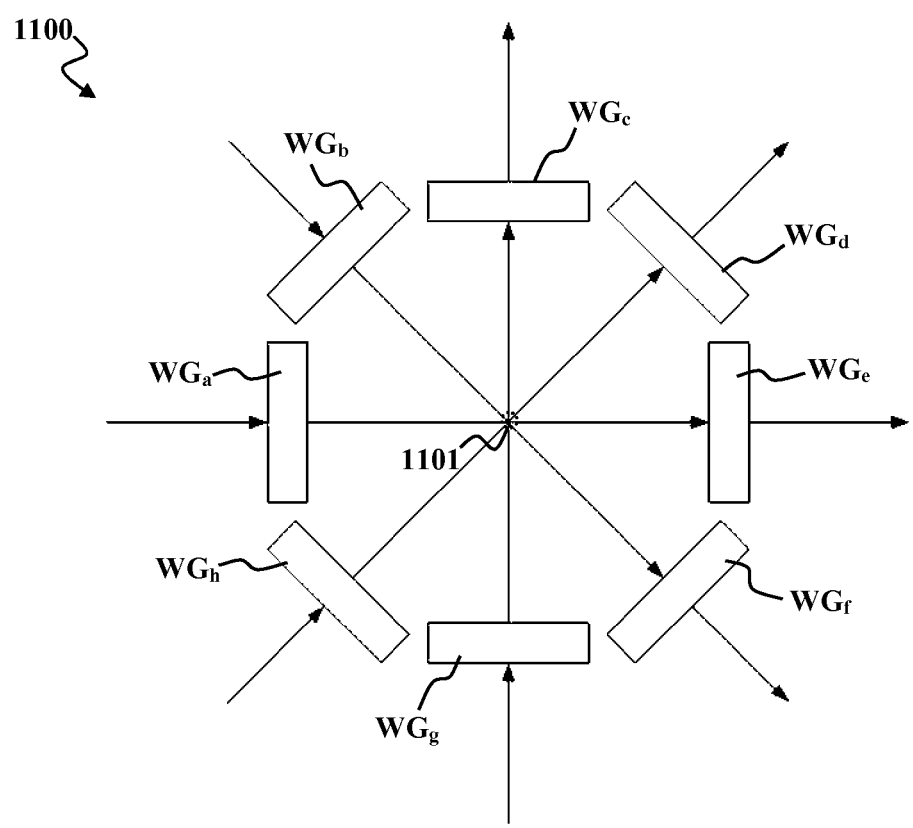
FIG. 11 illustrates an energy spectrometer according to an aspect of the present disclosure.

According to another aspect of the present disclosure, EO detectors as described herein may be configured to measure a charged particle beam energy spectrum. FIG. 11 depicts a top down view of a possible design of an energy spectrometer 1100 in which eighth EO detectors are arranged around the axis of a charged particle beam 1101 to capture the energy spectrum of the beam. Each EO detector includes a waveguide that is group-velocity-matched to a different beam energy setting. For simplicity, only the waveguide portions $WG_a$, $WG_b$, $WG_c$, $WG_d$, $WG_e$, $WG_f$, $WG_g$, and $WG_H$ of the detectors are shown. The detectors may be configured to operate, e.g., as shown in FIG. 5 or FIG. 8. Some alternative implementations may implement a combination of beam position sensing and energy spectrometry, e.g., by using waveguides $WG_a$ and $WG_e$ for the x position sensor and waveguides $WG_c$ and $WG_g$ for the y position sensor, while using the remaining waveguides $WG_b$, $WG_d$, $WG_f$, and $WG_h$ as energy detectors. The energy-sensing waveguides $WG_b$, $WG_d$, $WG_f$, and $WG_h$ may have different cross-sectional dimensions configured such that the group velocity of optical probe beams in those waveguides are matched to the velocities of charged particles of different corresponding energies. Alternatively, different frequencies of radiation may be used to adjust the group velocities.

Figure 12:
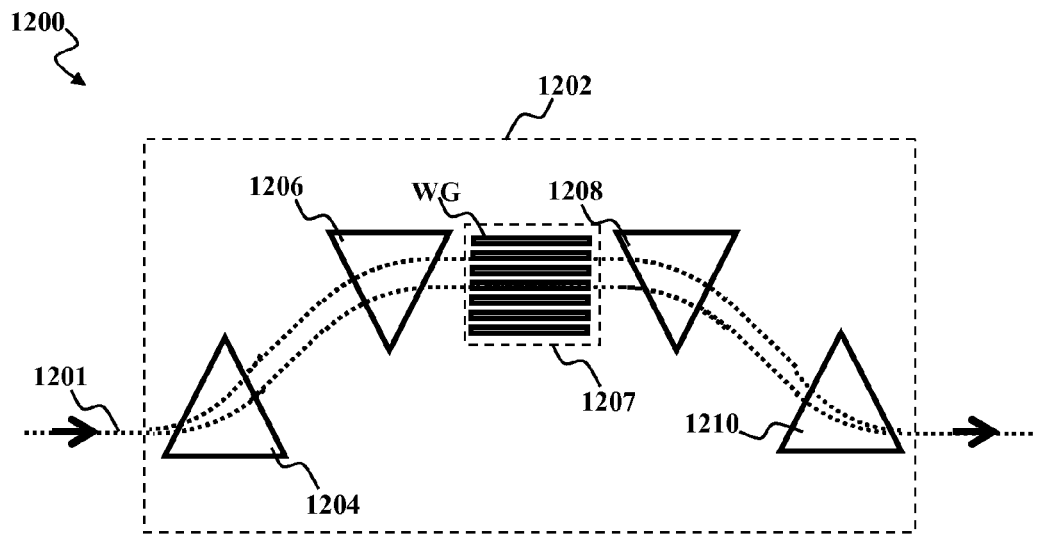
FIG. 12 details another implementation of an energy spectrometer according to an aspect of the present disclosure.

In some implementations, the charged particle beam may be spatially separated into different beams according to particle energy and the current of the separate beams may be measured. By way of example, FIG. 12 illustrates a system 1200 in which a charged particle beam 1201 is disperse using a chicane 1202. In the chicane, a first magnetic sector 1204 bends and spatially disperses the charged particle beam 1201 into different paths according to their velocities. A second magnetic sector 1206 bends the dispersed paths of the particles to make them parallel at a dispersion plane. EO detectors are arranged with an array 1207 of EO waveguides WG parallel to the paths of the particles in the dispersion plane. After the particles pass through the waveguide array 1207, two additional magnetic sectors 1208,1210 bend the dispersed paths of the particles and converge them back into a narrow beam.

Each waveguide WG in the array 1207 may be configured so that the group velocity of an optical probe beam in that waveguide is matched to the velocity of charged particles having the kinetic energy corresponding to its location in the dispersion plane. The energy resolution of the system 1200 is set by the spacing of the waveguides in the array and the dispersion value at the dispersion plane.

Figure 13:
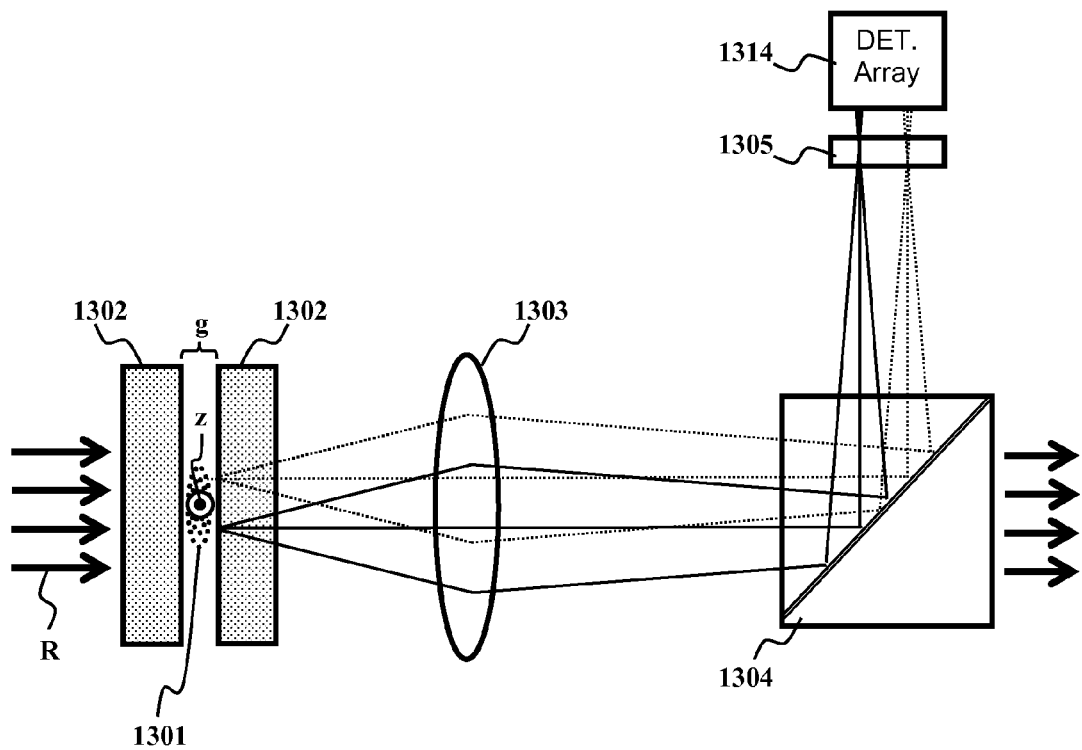
FIG. 13 illustrates a beam profile monitor according to an aspect of the present disclosure.

Aspects of the present disclosure also include implementations in which an electro optic apparatus is configured to operate as a beam profile monitor. For higher beam current or longer signal integration an imaging scheme that measures the spatial beam profile by imaging of the phase shift of a probe beam in an EO material is envisioned. By way of example, and not by way of limitation, as illustrated in FIG. 13, in an electro optic apparatus 1300 a charged particle beam 1301 traverses a gap g between two EO crystals 1302 in the z direction and a polarized collimated optical probe beam of radiation R travels through both crystals 1302 and across the gap in an orthogonal direction (e.g., the x direction, as shown in FIG. 13). In FIG. 13, the z-direction is perpendicular to the plane of the drawing towards the viewer. The collimated probe beam R is transported to a detector array via optics 1303 that image the face of one of the EO crystals 1302 through a polarizing beam splitter 1304 onto a detector array 1314, e.g., a charge-coupled device (CCD) array or similar device. An image intensifier 1305 may be placed between the beam splitter 1304 and the detector array 1314. By way of example and not by way of limitation, the image intensifier 1305 may be some kind of electron amplifier. Examples of electron amplifiers include MCP and PMT devices, both of which operate via an electron avalanche that creates an amplified electron signal. The beam splitter 1304 may be configured to act as an analyzer in a polarizer-analyzer mode so that the detector array 1314 is at a dark-port. The beam current density near the crystal face generates a spatially dependent polarization rotation that is proportional to the beam current density. This spatially dependent polarization rotation at the crystal face is the imaged onto the photo-detector array 1314, which produces an output A. In the example shown, the probe beam is dispersed in the z direction so that the output A can be interpreted as a plot of beam current density has a function of axial (z) position. In alternative implementations, the probe beam R may be collimated in a way that it is dispersed in the y direction (i.e., along a plane perpendicular to the x-z plane containing the beam 1301) and the output A may be interpreted as a plot of beam current density as a function of transverse (y) position.

To allow for a shallow depth-of-focus for the probe beam and to image the beam profile a line-focusing (e.g., quadrupole) beam transport scheme may be used for the charged particle beam 1301. In other alternative implementations, a detector apparatus that uses an array of parallel EO waveguides such as those described above with respect to FIG. 12 could accomplish the same beam profile monitoring function.

Those skilled in the art will recognize that two or more the functions of apparatus of the type described above, e.g., beam current monitoring, beam position monitoring, beam energy spectrometry, or beam profile monitoring may be implemented in a multi-function monitor that uses one or more EO or other wakefield charged particle detectors.

The implementations described above are configured to monitor the non-radiative field component of the free electron by means of a second-order effect in a crystal. However, aspects of the present disclosure are not limited to such implementations. In some alternative implementations, wakefield beam interaction mechanisms other than electro optic interactions may be used. By way of example, and not by way of limitation, radiative mechanisms that may be employed include generation of radiation by an undulator in which a charged particle beam (e.g., an electron beam) passes between arrays of magnets that produce transverse magnetic fields of alternating direction. Other alternative implementations may utilize the Cerenkov effect, in which electromagnetic radiation is emitted when a charged particle (such as an electron) passes through a homogeneous dielectric medium at a speed greater than the phase velocity of light in that medium. Still other alternative implementations may be based on generation of transition radiation by passing charged particles through an inhomogeneous medium, such as a boundary between two different media. Yet other alternative implementations may be based on generation of radiation by the Smith-Purcell effect by passing an energetic beam of charged particles near a grating or other photonic structure. Of the aforementioned mechanisms, Smith-Purcell is perhaps the most efficient mechanism and has been observed from a non-relativistic electron beam. The main problem for the radiative schemes is the efficiency for the free-electron to radiate a photon, as for even the most efficient photonic structures the coupling coefficient is orders of magnitude smaller than 1. Therefore for a typical SEM beam current and any reasonably-sized photonic structure (e.g. gratings) that would probe it the resulting photon current and signal will be relatively small.

By way of further example, radiative probing of a charged particle beam with a laser beam could also done by Compton scattering instead of the electro optic effect or other wakefield effect if the probing laser beam has a sufficiently large amount of power. Compton scattering refers to an inelastic scattering of a photon by a quasi-free charged particle, e.g., an electron. Such scatter decreases the energy of the photon (which may be an X-ray or gamma ray photon). The increase in energy may be observed as an increase in wavelength)

For example, the low-energy limit of the Klein-Nishia formula for photon-electron scattering cross-section is given by:

$$\frac{d\sigma}{d\Omega} \sim r_e^2 \sim 7.8 \times 10^{-30} m^2$$

The transit time t of a free electron through the focus of a laser beam with waist $w_0$ is approximately ½ μm, l=532 nm; assume an electron kinetic energy of ~4 kV, the electron velocity is about 0.2c, where c is the speed of light in vacuum. Therefore, $$t = \frac{c}{\omega_0^2} \sim 2 \times 10^{-15} \text{sec}$$

The probability T for a photon scattering event for this laser beam is ratio of the electron cross-section and the laser focus area probing it is given approximately by:

$$T \sim \frac{4\pi r_e^2}{\omega_0^2} \sim 4 \times 10^{-16}$$

The required CW power to generate 1 scattered photon per free electron is therefore $$P \sim \frac{hc}{T t \lambda} \sim 5 \times 10^{11} W$$

While the above includes a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶6. In particular, the use of "step of" in the claims herein is not intended to invoke the provisions of 35 USC §112, ¶6.

What is claimed is:

1. A system, comprising:
    a) a set of one or more electro-optic (EO) materials placed in close proximity to a design trajectory of a charged particle beam; and
    b) a set of one or more optical probes configured to receive a beam of electromagnetic radiation and probe a change of refractive index of the one or more EO materials resulting from passage of the charged particle from the beam due to the electro-optic effect of the charged particle's electromagnetic field; and
    c) a set of one or more photon detectors coupled to the one or more optical probes, wherein each photon detector in the set is configured to produce a photon signal that corresponds to the change of refractive index of a corresponding EO material of the set of one of the one or more EO materials.

2. The system of claim 1, wherein the set of one or more photon detectors includes a photon detector coupled to a dark port of a particular optical probe of the set of one or more optical probes.

3. The system of claim 2, wherein the optical probe of the set of one or more optical probes is configured to direct radiation from the beam of electromagnetic radiation of a first polarization into a particular EO material of the set of one or more electro-optic (EO) materials, wherein the particular optical probe includes a polarizing beam splitter configured to receive at least a portion of the beam of electromagnetic radiation that has traveled in the particular EO material and direct radiation of a second polarization that is orthogonal to the first polarization to a particular photon detector of the set of one or more photon detectors.

4. The system of claim 1, wherein the set of one or more optical probes includes a particular optical probe configured to couple at least a portion of the beam of electromagnetic radiation onto a waveguide structure in a particular EO material of the set of one or more EO materials, wherein the waveguide structure is configured to direct the portion of the beam of electromagnetic radiation in a direction substantially parallel to a direction of a portion of the charged particle beam beam's design trajectory that is proximate the waveguide structure.

5. The system of claim 4, wherein the waveguide structure is configured such that a group velocity of the portion of the beam of electromagnetic radiation in the waveguide structure is approximately equal to a velocity of charged particles in the charged particle beam to within a range of adjustment of the velocity of the charged particles.

6. The system of claim 1, further comprising a secondary particle detector configured to produce a secondary signal in response to detection of secondary particles generated by interaction between the charged particle beam and a target.

7. The system of claim 6, further comprising a signal processor coupled to the photon detector and the secondary particle detector, wherein the signal processor is configured to use the photon signal from a photon detector in the set of photon detectors to apply a noise cancellation to the secondary signal thereby producing a processed signal.

8. The system of claim 7, wherein the processed signal corresponds to a ratio of the secondary signal to the photon signal.

9. The system of claim 1, wherein a signal from the photon detector provides a servo input that is used to control a property of the charged particle beam.

10. The system of claim 1, wherein the set of one or more optical probes is configured to implement a beam position monitor that measures a position of the charged particle beam.

11. The system of claim 1, wherein the set of one or more optical probes is configured to implement a beam profile monitor.

12. The system of claim 1, wherein the set of one or more optical probes is configured to implement an energy spectrometer.

13. The system of claim 1, the set of one or more optical probes is configured to implement a multi-function beam monitor.

14. The system of claim 13, wherein the multi-function monitor implements two or more of the following functions: beam current monitoring, beam position monitoring, beam energy spectrometry, or beam profile monitoring.

15. The system of claim 1, further comprising a charged particle beam optical column configured to produce the charged particle beam.

16. The system of claim 15, wherein the charged particle beam is an electron beam.

17. The system of claim 16, wherein the charged particle beam optical column is part of a scanning electron microscope.

18. The system of claim 15, wherein a signal from the photon detector provides a servo input to a controller coupled to the charged particle beam optical column that is used to control a property of the charged particle beam.

19. A system, comprising:
    a) a set of one or more electromagnetic wakefield detectors placed in close proximity to a design trajectory of a non-relativistic charged particle beam, wherein the set of one or more wakefield detectors is configured to produce one or more optical signals in response to passage of the charged particle beam without interrupting the charged particle beam; and c) a set of one or more photon detectors configured to receive the one or more optical signals and produce one or more corresponding outputs.

20. The system of claim 19, the set of one or more electromagnetic wakefield detectors is configured to implement a multi-function beam monitor that implements two or more of the following functions: beam current monitoring, beam position monitoring, beam energy spectrometry, or beam profile monitoring.

21. The system of claim 19, wherein the set of one or more electromagnetic wakefield detectors includes a detector based on one or more of the following: the electro optic effect, image charge generation, radiation by an undulator, the Cerenkov effect, generation of transition radiation, generation of radiation by the Smith-Purcell effect, or Compton scattering.

* * * * *